US012660543B2

(12) United States Patent
Moon et al.

(10) Patent No.: US 12,660,543 B2
(45) Date of Patent: Jun. 16, 2026

(54) METHOD FOR MAKING SEMICONDUCTOR PACKAGES

(71) Applicant: STATS ChipPAC Pte. Ltd., Singapore (SG)

(72) Inventors: JiSik Moon, Incheon (KR); DongJun Seo, Incheon (KR); JungSub Lee, Incheon (KR); KyoWang Koo, Incheon (KR)

(*) Notice: Subject to any disclaimer, the term of this patent is extended or adjusted under 35 U.S.C. 154(b) by 557 days.

(21) Appl. No.: 18/165,347

(22) Filed: Feb. 7, 2023

(65) Prior Publication Data

US 2023/0268315 A1 Aug. 24, 2023

(30) Foreign Application Priority Data

Feb. 24, 2022 (CN) .......................... 202210173193.5

(51) Int. Cl.
| | |
|---|---|
| *H10W 42/20* | (2026.01) |
| *H10P 54/00* | (2026.01) |
| *H10P 72/70* | (2026.01) |
| *H10W 72/00* | (2026.01) |

(52) U.S. Cl.
CPC ............. *H10W 42/20* (2026.01); *H10P 54/00* (2026.01); *H10P 72/7402* (2026.01); *H10W 72/0198* (2026.01)

(58) Field of Classification Search
None
See application file for complete search history.

(56) References Cited

U.S. PATENT DOCUMENTS

| | | | | |
|---|---|---|---|---|
| 6,309,943 | B1* | 10/2001 | Glenn ................... | H01L 23/544 |
| | | | | 257/E23.179 |
| 11,145,603 | B2 | 10/2021 | Han et al. | |
| 2001/0042902 | A1* | 11/2001 | Wakabayashi .......... | H01L 24/12 |
| | | | | 257/E23.021 |
| 2005/0006728 | A1* | 1/2005 | Shizuno .................. | H01L 22/34 |
| | | | | 257/642 |
| 2009/0121337 | A1* | 5/2009 | Abe ....................... | H01L 21/268 |
| | | | | 257/E21.237 |
| 2010/0048001 | A1* | 2/2010 | Harikai ................. | H01L 21/308 |
| | | | | 438/464 |
| 2010/0173474 | A1* | 7/2010 | Arita .................... | H01L 21/6836 |
| | | | | 257/E21.599 |
| 2011/0304007 | A1* | 12/2011 | Watanabe ............... | H01L 23/00 |
| | | | | 257/E21.599 |

(Continued)

FOREIGN PATENT DOCUMENTS

TW 201931448 A 8/2019

*Primary Examiner* — Erik T. K. Peterson

(74) *Attorney, Agent, or Firm* — Junhe Law Office, P.C.; Yi Zhang

(57) ABSTRACT

The present application relates to a method for making semiconductor packages. The method for making semiconductor packages comprises forming a semiconductor package array, the semiconductor package array having at its first side a interconnect encasing layer; attaching an adhesive tape onto the interconnect encasing layer, wherein the adhesive layer has an adhesive layer and a base film; removing, by a laser beam, the base film of the adhesive tape at a predetermined ablation region; and singulating the semiconductor package array along the predetermined ablation regions to separate the semiconductor package array into a plurality of semiconductor packages.

14 Claims, 8 Drawing Sheets

(56)                    References Cited

U.S. PATENT DOCUMENTS

| | | | | |
|---|---|---|---|---|
| 2012/0018854 A1* | 1/2012 | Kato | H01L 21/67092 | |
| | | | 257/E23.179 | |
| 2013/0075869 A1* | 3/2013 | Mackh | H01L 21/78 | |
| | | | 257/E23.179 | |
| 2013/0087949 A1* | 4/2013 | Kitahara | H01L 21/6836 | |
| | | | 264/400 | |
| 2014/0106511 A1 | 4/2014 | Juskey et al. | | |
| 2016/0300799 A1* | 10/2016 | Han | H01L 21/6835 | |
| 2017/0141046 A1* | 5/2017 | Jeong | H01L 21/6836 | |
| 2017/0330839 A1* | 11/2017 | Kim | H01L 23/04 | |
| 2018/0012787 A1* | 1/2018 | Oka | H01L 21/3065 | |
| 2018/0197823 A1* | 7/2018 | Suzuki | H01L 23/3114 | |
| 2018/0204808 A1* | 7/2018 | Mariani | H10D 8/00 | |
| 2019/0304838 A1* | 10/2019 | Saeki | H01L 21/30655 | |
| 2020/0020585 A1* | 1/2020 | Wakahara | H01L 21/0206 | |
| 2020/0126929 A1 | 4/2020 | Jeong et al. | | |
| 2021/0125959 A1* | 4/2021 | Matsuura | H01L 21/561 | |
| 2022/0208689 A1* | 6/2022 | Noguchi | H01L 23/3121 | |

* cited by examiner

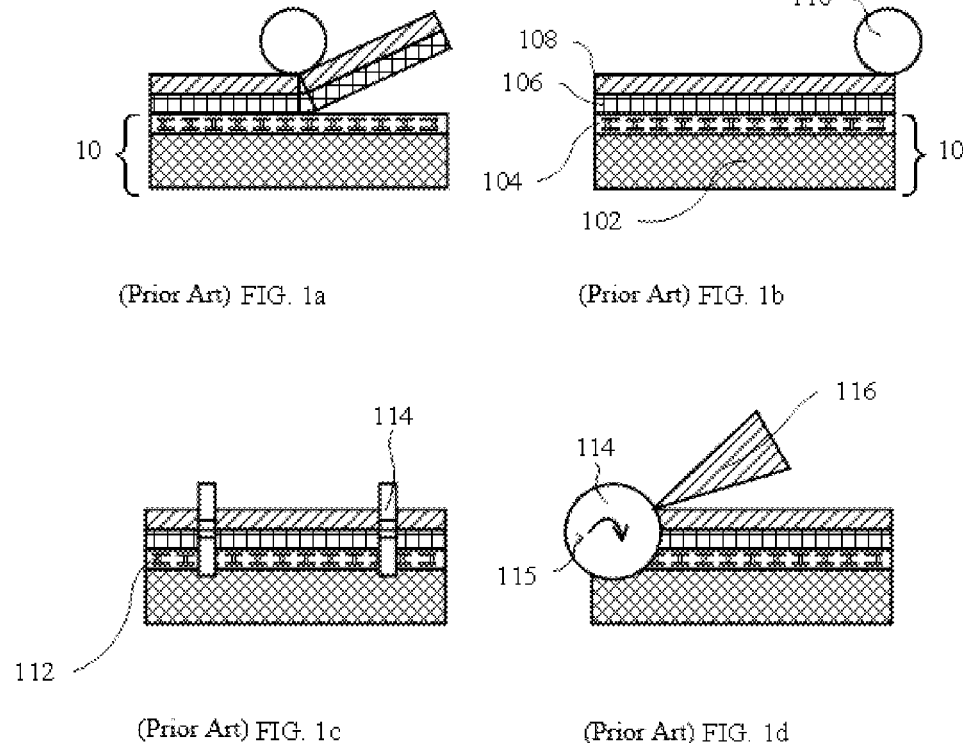
(Prior Art) FIG. 1a
(Prior Art) FIG. 1b
(Prior Art) FIG. 1c
(Prior Art) FIG. 1d

S302

S310 irradiating forming semiconductor package array

S304 attaching an adhesive tape

S306 removing the base film of the adhesive tape

S308 singulating the semiconductor package array

30

S302

S310 irradiating forming semiconductor package array

S304 attaching an adhesive tape

S306 removing the base film of the adhesive tape

S308 singulating the semiconductor package array

S404 depositing

S402 applying a conductive shield

40

50

60

702

704

70

S802          S804          S806          S808

S810          S812          S814

80

S902          S904          S906          S908

S910          S912          S914

90

METHOD FOR MAKING SEMICONDUCTOR PACKAGES

TECHNICAL FIELD

The present application generally relates to semiconductor technology, and more particularly, to a method for making semiconductor packages.

BACKGROUND OF THE INVENTION

Singulation is an intermediate process for separating a semiconductor package array or strip into several function-independent semiconductor packages or devices. Prior to the singulation process, an ultraviolet (UV) tape can be adhered to the molded semiconductor package array or strip for protecting such as contacts on one side of the molded semiconductor package array or strip. Furthermore, after the singulation process, a metal shield may be formed enclosing the semiconductor package. However, metals shields formed in this way may have various defects such as abnormal shields or metal burrs, thereby lowering electromagnetic shielding performance of the semiconductor packages.

Therefore, a need exists for improving the singulation process.

SUMMARY OF THE INVENTION

An objective of the present application is to provide a method for making semiconductor packages with improved metal shielding performance.

According to an aspect of embodiments of the present application, there is provided a method for making semiconductor packages. Wherein, the method includes the following steps: forming a semiconductor package array, the semiconductor package array having at its first side a interconnect encasing layer; attaching an adhesive tape onto the interconnect encasing layer, wherein the adhesive tape has an adhesive layer and a base film; removing, by a laser beam, the base film of the adhesive tape at a predetermined ablation region; and singulating the semiconductor package array along the predetermined ablation regions to separate the semiconductor package array into a plurality of semiconductor packages.

In some of the embodiments, optionally, the method further includes a step of applying a conductive shield at a second side of each of the plurality of semiconductor packages, wherein the second side is opposite to the first side.

In some of the embodiments, optionally, the adhesive tape is UV sensitive, and the method further includes a step of irradiating the adhesive tape with UV light before removing the base film of the adhesive tape.

In some of the embodiments, optionally, the conductive shield is applied by any of the following: sputtering, spraying, electroplating, printing, painting, laminating, and physical vapor deposition (PVD).

In some of the embodiments, optionally, the conductive shield comprises at least one of the following materials: silver, copper, aluminum, nickel, palladium and chromium.

In some of the embodiments, optionally, before applying a conductive shield at a second side of each of the plurality of semiconductor packages, the method further includes a step of transferring the plurality of semiconductor packages onto a deposition tape, wherein the adhesive tape is adhered to the deposition tape.

In some of the embodiments, optionally, before removing the base film of the adhesive tape, the method further includes a step of forming laser markings at a second side of the semiconductor package array, wherein the second side is opposite to the first side.

In some of the embodiments, optionally, the step of forming laser markings at a second side of the semiconductor package array is prior to the step of attaching an adhesive tape onto the interconnect encasing layer.

In some of the embodiments, optionally, the method further includes the step of forming laser markings at a second side of the semiconductor package array subsequent to the irradiating step, wherein the second side is opposite to the first side.

In some of the embodiments, optionally, the steps of forming laser markings at a second side of the semiconductor package array and removing the base film of the adhesive tape at a predetermined ablation region are implemented on a rotatable table holding the semiconductor package array.

In some of the embodiments, optionally, the predetermined ablation region includes a plurality of lines each overlying a respective one of a plurality of saw streets.

In some of the embodiments, optionally, a width of each of the lines is wider than the respective one of the plurality of saw streets.

In some of the embodiments, optionally, the predetermined ablation region includes a plurality of crossings each overlying a crossing of two of a plurality of saw streets.

In some of the embodiments, optionally, a width of each of the crossings is larger than the widths of each of respective two of the plurality of saw streets.

In some of the embodiments, optionally, the predetermined ablation region includes a plurality of circles each centered at a crossing of two of a plurality of saw streets.

In some of the embodiments, optionally, the diameter of each of the circles is larger than the widths of each of the respective two of the plurality of saw streets.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 1a to 1d show a conventional singulation process for singulating a semiconductor package array.

The same reference numbers will be used throughout the drawings to refer to the same or like parts.

DETAILED DESCRIPTION OF THE INVENTION

Figures 2A, 2B, 2C, 2D:
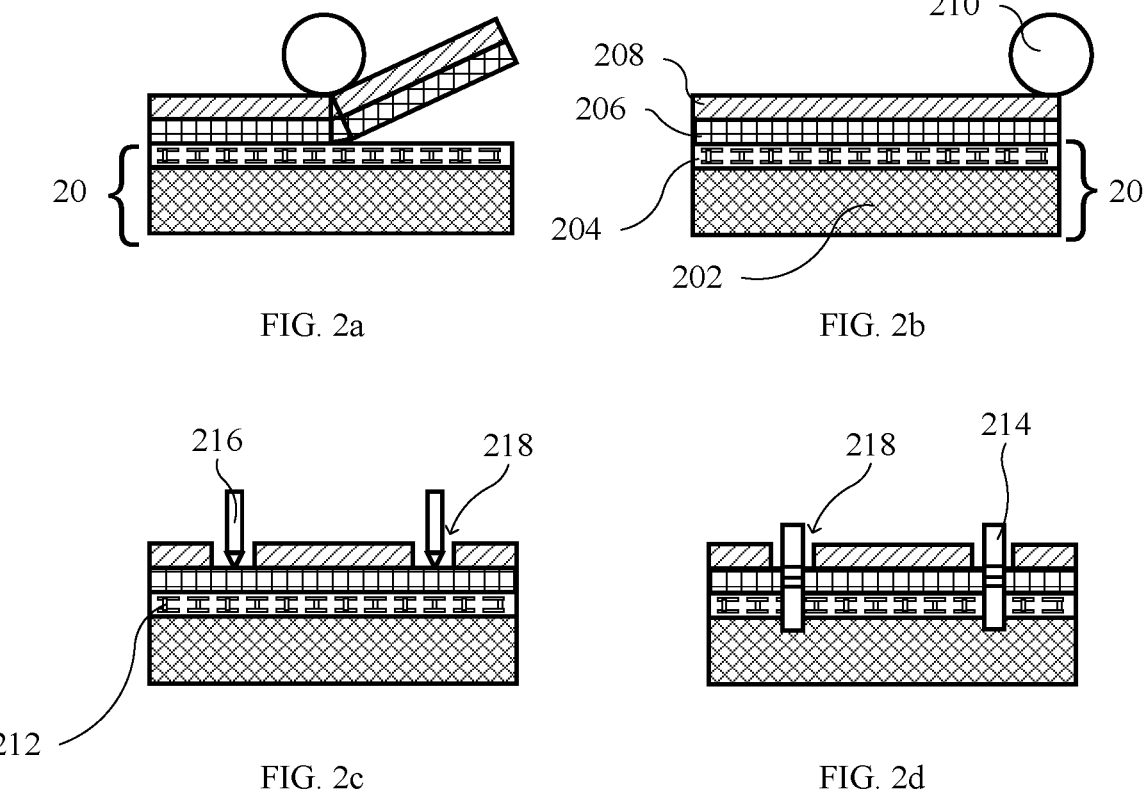
FIGS. 2a to 2d show a singulation process for singulating a semiconductor package array according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In the present application, the use of the singular includes the plural unless specifically stated otherwise. In the present application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

After a lot of test and validation work, the inventors of the present application have found that, singulating a semiconductor package array with cutting saw(s) may generate many tape burrs adjacent to cutting edges between separated semiconductor packages. These undesired tape burrs may adversely affect subsequent shielding of the separated semiconductor packages, as they may block the shielding metal from attaching onto the semiconductor packages. Hence, electromagnetic shielding performance of the semiconductor packages may be deteriorated. In order to address the tape burrs issue, a pre-removing process of a tape attached to the semiconductor package array may be implemented prior to the singulation according to certain embodiments of the present application, the details of which will be elaborated below.

FIGS. 1*a* to 1*d* show a conventional singulation process. As shown in FIG. 1*a,* a UV tape including two layers 106 and 108 can be adhered to a molded semiconductor package array 10 or a molded semiconductor package strip by a roller 110. The molded semiconductor package array 10 may have more than one row and/or more than one column of semiconductor packages. Each semiconductor package may have one or more semiconductor dies built inside the package. The UV tape, or other types of protective material, can be laminated on one side of the molded semiconductor package array 10. The UV tape refers to a type of tape which is UV sensitive and may be hardened after irradiation by UV light with a certain wavelength range. As further illustrated in FIG. 1*b,* the UV tape is laminated on a substrate layer or interconnect encasing layer 104 of the semiconductor package array 10. The semiconductor package array 10 has a molding portion 102 below the interconnect encasing layer 104, where the semiconductor die(s) are enclosed and protected from external mechanical, electrical and/or chemical contamination or shock. The interconnect encasing layer 104 may include a plurality of conductive circuit patterns 112 (e.g., interconnect) that are electrically connected to bumps (not shown for simplicity) on the top side of the interconnect encasing layer 104 and to the semiconductor dies.

The UV tape 106 includes a base film 108 and an adhesive layer 106. When laminated by a rolling mechanism (e.g., a roller 110 shown in FIGS. 1*a* and 1*b*), the adhesive layer 106 can be used to fill up vacancies or recesses among the bumps (not shown for simplicity) exposed from the interconnect encasing layer 104, thereby forming a flat intermediate layer for the base film 108. The base film 108 and the adhesive layer 106, when irradiated by UV light, can be hardened. In other embodiments, the base film 108 and the adhesive layer 106 may be hardened by heat, e.g., through an annealing process.

With further reference to FIGS. 1*c* and 1*d,* wherein FIG. 1*d* is a sectional view seen from a saw street in FIG. 1*c,* when one or more saws 114 are employed to separate the molded semiconductor package array 10 rolling in the direction 115, the cutting edges of the UV tape may be not ideally neat, while leaving some burrs 116 extending from the cutting edges shown in FIG. 1*d.* These tap burrs 116, which are crumbs from the base film, may affect the following sputtering process, for example. In a later stage, the separated semiconductor packages with burrs 116 may be sputtered with metal materials for electromagnetic shielding, however, the burrs 116 may disturb the continuity and uniformity of the sputtered metal shielding outside of the semiconductor packages.

As mentioned above, these tape burrs 116 are caused by the imperfect separation of the base film 108. According to some embodiments of the present application, there is provided a method for reducing or avoiding the generation of tape burrs. In some of the embodiments, the base film may be removed beforehand through a laser ablation process, at positions where the semiconductor package array may be further singulated by saws or any other mechanical cutting means.

Figure 3:
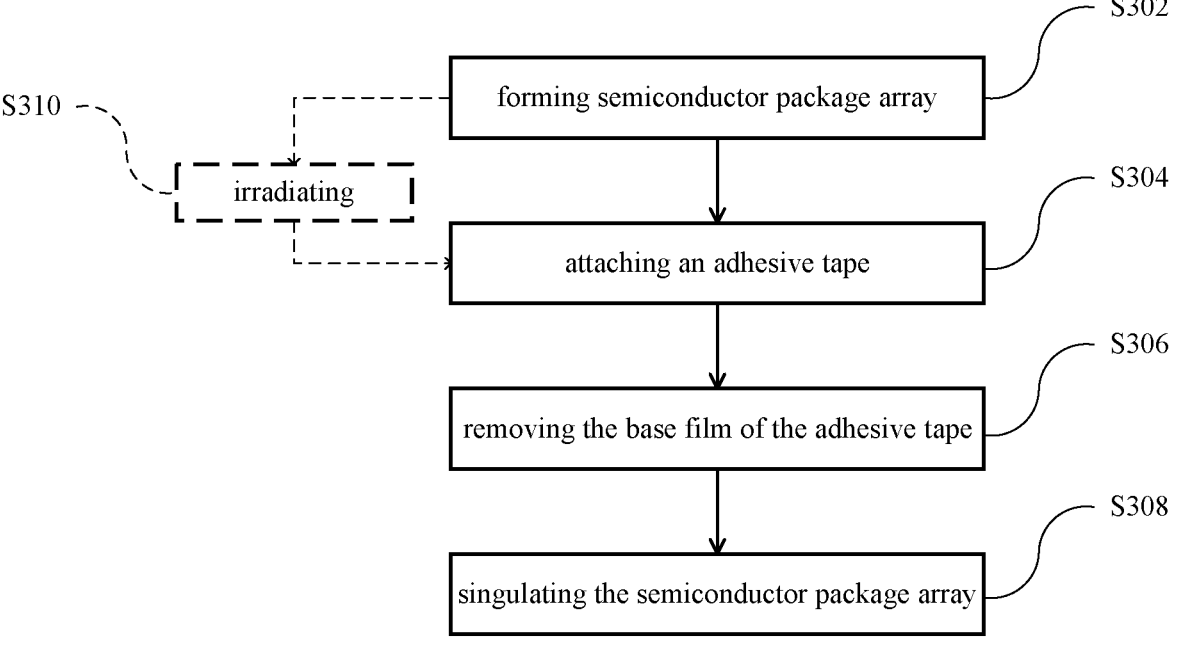
FIG. 3 shows a method for making semiconductor packages according to an embodiment of the present application.

FIGS. 2*a* to 2*d* show perspective views of a semiconductor package array during a method for making semiconductor packages according to an embodiment of the present application. FIG. 3 shows a flow chart of the method for making semiconductor packages. In the following, the method will be elaborated with more details with reference to FIGS. 2*a* to 2*d* and FIG. 3.

As shown in FIG. 3, the method 30 includes forming a semiconductor package array at step S302. Referring to FIGS. 2*a* to 2*d,* in some examples, the semiconductor package array 20 may have an interconnect encasing layer 204 on a first side, i.e., the top side. The interconnect encasing layer 204 includes some bumps or contacts which may reduce the flatness of the top side. The semiconductor package array 20 may pre-built semiconductor packages that need to be separated into individual functional entities. In some examples, the semiconductor package array may have only one row/column, and in these examples, the semiconductor package array may be referred to as a semiconductor package strip.

At step S304, an adhesive tape may be attached onto the interconnect encasing layer of the semiconductor package array. Turning to FIGS. 2a and 2b, the adhesive tape may have an adhesive layer 206 and a base film 208, and the base film 208 may be attached to the interconnect encasing layer 204 via the adhesive layer 206. The adhesive layer 206 can be in the form of glue or other forms that are adaptable to the interconnect encasing layer 204 by filling vacancies on the top side of the interconnect encasing layer 204. As illustrated in FIGS. 2a and 2b, the adhesive tape can be flattened to the interconnect encasing layer 204 by scrolling with a roller 210 from one end of the interconnect encasing layer 204 to the other end, which is also called pre-tape lamination in the industry. Moreover, one or more conductive circuit patterns 212 may be formed in the interconnect encasing layer 204.

Figure 5:
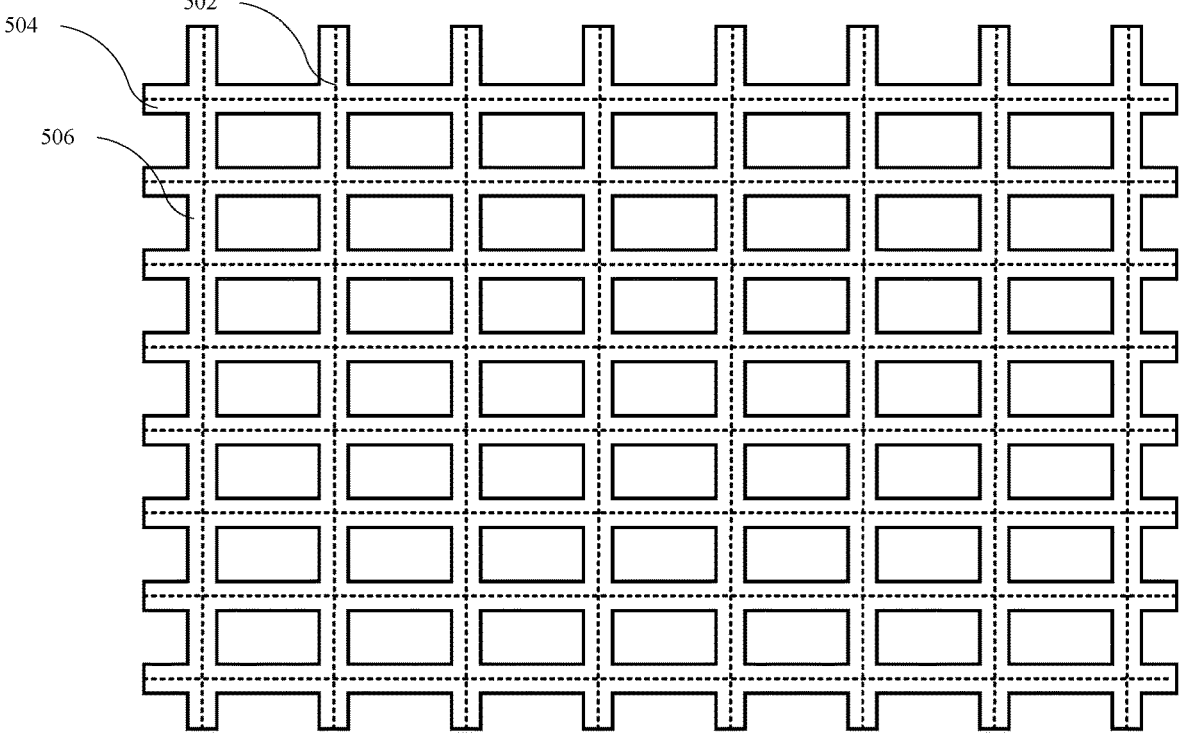
FIGS. 5 to 7 show three ablation region layouts according to embodiments of the present application.
Figure 6:
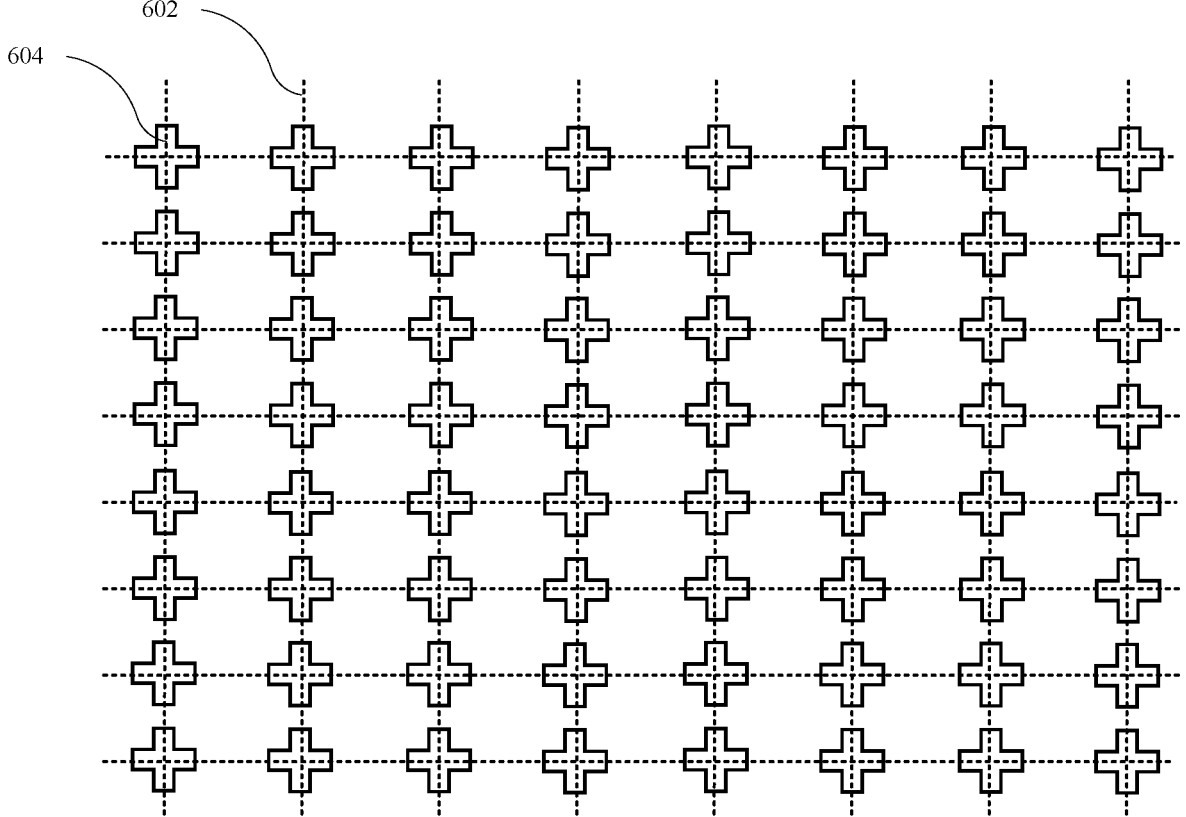
Figure 7:
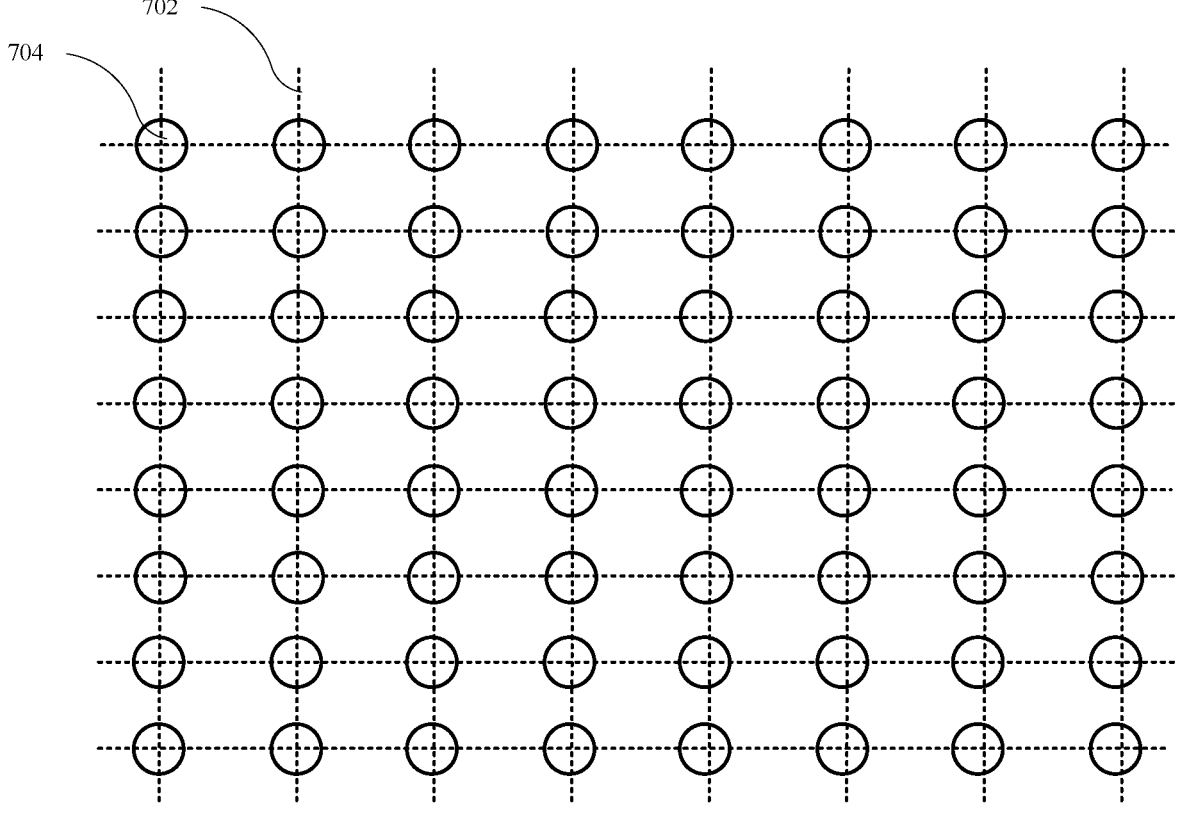

At step S306, the base film of the adhesive tape may be partially removed by laser ablation. Turning to FIGS. 2c and 2d, the removal of the base film 208 can be performed at one or more predetermined ablation regions 218. In some embodiments, the ablation regions 218 may include several connected and/or isolated regions. In some aspects of the present application, the ablation regions 218 are where singulation will be applied with such as cutting saw(s) 214. In other aspects of the present application, the ablation regions 218 can be positioned at where the singulation can be guided. Several exemplary patterns or layouts of the ablation regions 218 are shown in FIGS. 5 to 7.

As described above, the imperfect separation of the base film results in the tape burrs. By removal of the base film 208 at the ablation regions 218 beforehand, the cutting saws 214 may not cause burrs adjacent to the ablation regions 218, thus it would not affect the following sputtering process if applicable.

FIG. 2c shows that the base film at the ablation regions 218 can be removed by laser beams 216. The power and duration of the laser beams 216 can be specifically configured so that the base film at the ablation regions 218 can be removed thoroughly, without significantly affecting the underlying adhesive layer. In some examples, the laser beams 216 may be emitted into the adhesive layer 206 for some depth to completely remove the base film at the ablation regions 218, that is, the adhesive layer 206 may be removed partially. The power and duration of the laser beams 216 can be configured according to experience, computation, and/or experimental results.

At step S308, singulation of the semiconductor package array is performed along the predetermined ablation regions so as to separate the semiconductor package array into a plurality of semiconductor packages. FIG. 2d shows that cutting saws 214 cut through the package array to separate the semiconductor packages from each other. It can be seen that the cutting saws 214 are generally aligned with the ablation regions 218 to ensure desired separation of the adhesive tape. In some examples, a width of the removed base film may be 0.2 to 2 times a width of the cutting saws 214. In some other examples, a width of the removed base film may be 0.1 mm to 5 mm.

In some embodiments, the adhesive tape can be hardened by UV light. Accordingly, the method 30 may also include at step S310 irradiating the adhesive tape with UV light, before removing the base film of the adhesive tape at step S306. The intermediate adhesive layer may be an acryl- or silicone-based intermediate layer which is curable by UV rays. The hardened adhesive layer can be cut through with a mechanical force. In other embodiments, the adhesive layer may be hardened by heat as well.

Figure 4:
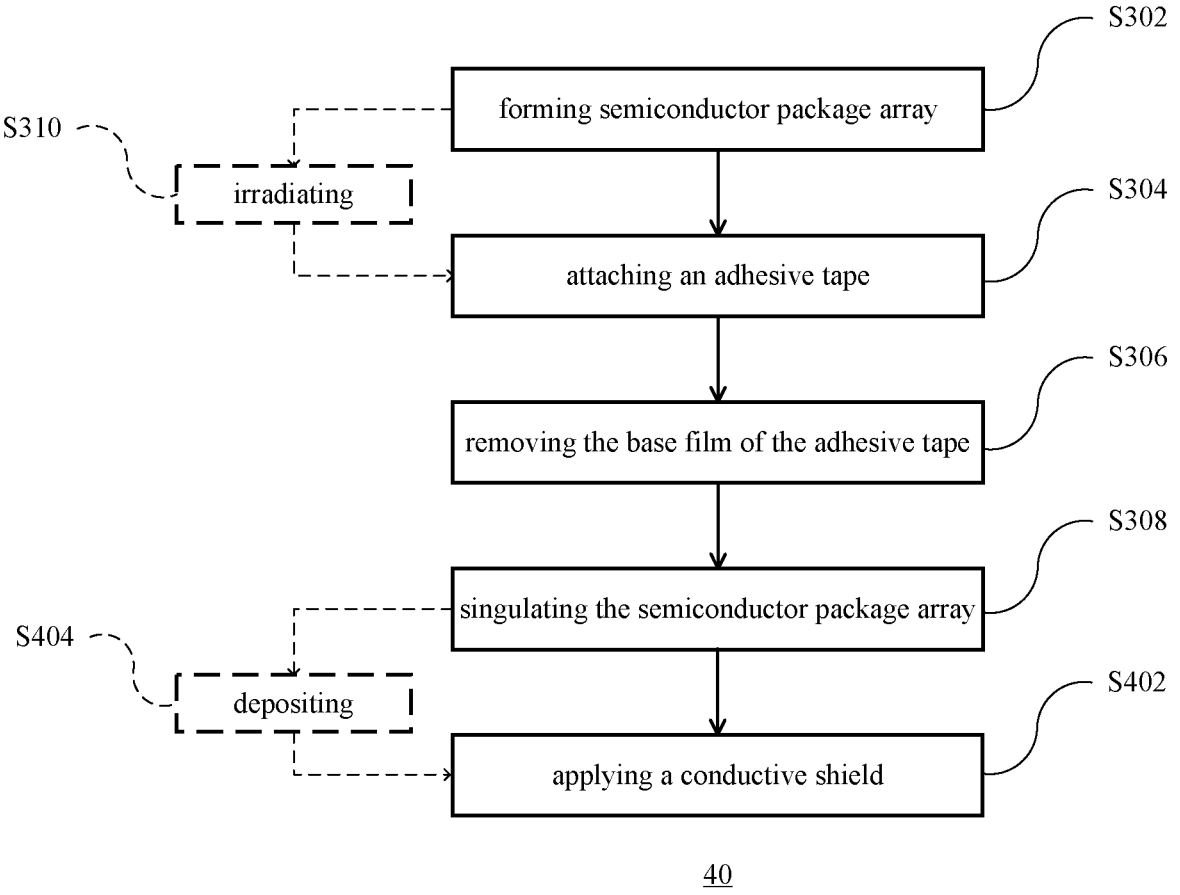
FIG. 4 shows a method for making semiconductor packages according to an embodiment of the present application.

FIG. 4 shows a method for making semiconductor packages according to another embodiment of the present application. As shown in FIG. 4, the method 40 includes steps S302, S304, S306, S308, optionally step S310 which may be similar to or identical to the steps shown in FIG. 3, and thus will not be elaborated herein.

In particular, after step S308 of singulating the semiconductor package array, the method 40 further includes applying a conductive shield at a second side of each of the semiconductor packages at step S402. The second side can be opposite to the first side, e.g. the bottom side of the semiconductor packages. When mounted onto such as a printed circuit board (PCB), the second side of the semiconductor package may be farther away from the PCB than the first side, thereby protecting the semiconductor package enclosed therein from external mechanical shock or other types of shock. In some embodiments, an electromagnetic shielding layer may be applied to the singulated semiconductor packages by sputtering, thus forming a conductive shielding layer protecting from outer electromagnetic interference (EMI). Furthermore, as undesired tape burrs are removed or avoided at previous steps, the step S402 of applying the protective layer would not be affected by the undesired tape burrs. In other words, the shielding layer can be formed on all the exposed surfaces of the semiconductor packages, except for the bottom surfaces which are not exposed due to attachment to a deposition tape (not shown).

It should be appreciated that, in other embodiments, the shielding layer may be applied by spraying, electroplating, printing, painting, laminating, or by physical vapor deposition (PVD). The shielding layer may include at least one of silver, copper, aluminum, nickel, palladium, chromium, and other similar materials. A thickness of the shielding layer can be from about 0.1 μtm to about 25 μm, for example.

In some embodiments, before step S402, the method 40 may transfer the plurality of semiconductor packages onto the deposition tape at step S404. For example, the semiconductor packages can be adhered onto the deposition tape. The deposition tape can hold the semiconductor packages in place such that the shielding layer can be formed on the semiconductor packages later. The deposition tape may be a polyimide layer or other heat resistant adhesive layer to maintain the position of the semiconductor packages during the applying process at S402.

Moreover, although not shown in FIG. 4, the method 40 may also include a step of separating the semiconductor packages from the deposition tape. At this time, the deposition tape and the adhesive tape may be peeled from the semiconductor packages using a tool for pulling the tape, such as pliers.

In some embodiments of the present application, the patterns of the ablation regions are specially designed. FIGS. 5 to 7 show three ablation region layouts or patterns according to examples of the present application. In particular, the saw streets are indicated by dotted lines while the ablation regions are illustrated with solid lines. It can be understood that the patterns elaborated in accompany with the drawings are just by way of example, and the present application does not intend to limit therewith. The size of the ablation regions and the saw streets are not drawn scale, and some of the dimensions are exaggerated to clearly illustrate the relationship between the ablation regions and the saw streets.

In a general aspect of the present application, the ablation regions are "predetermined" with respect to the saw streets. In this aspect, the ablation regions are not only for a laser beam to remove the base film but also for a saw to conduct singulation for the semiconductor package array.

In some of the embodiments, as shown in FIG. 5, the ablation regions may include a plurality of lines 504, 506, and each of the lines 504, 506 is aligned with a respective street of a plurality of saw streets 502. Since the semiconductor package array may include semiconductor packages arranged in rows and columns, the saw streets 502 to separate semiconductor packages can be arranged between the corresponding rows and columns. For example, FIG. 5 shows eight horizontal saw streets 502 and eight vertical saw streets 502, by which the semiconductor package array can be divided into 9*9 pieces, and among them, some are individual semiconductor packages.

Referring to FIG. 5, the ablation regions include eight horizontal lines 504 and eight vertical lines 506, with each aligned with a respective one of a plurality of saw streets 502. The ablation regions may cover all the saw streets, therefore a complete removal of the undesired base film adjacent to the cutting edges along the saw streets can be achieved.

The lines 504, 506 at the ablation regions can be wider than the respective one of the saw streets 502 and its corresponding incision with the saw, thus the laser beams can diminish the base film in a larger area than the saw streets 502 and hence their corresponding cutting incisions. Therefore, there would be no base film left around the cutting edges in accordance with the saw streets 502, and hence no burrs will be produced.

In some of the embodiments, the ablation regions may not cover all areas of the saw streets. As most of the tape burrs may be generated at the crossings of saw streets, ablation regions that cover the crossings of saw streets may mitigate the tape burr problem to a great extent. FIG. 6 shows ablation regions in the form of a plurality of crossings 604, and each crossing 604 is aligned with a crossing of saw streets 602. Moreover, FIG. 7 shows ablation regions in the form of a plurality of circles 704, and each circle 704 is centered at a crossing of the saw streets 702. The crossings 604 in FIG. 6 or the circles 704 in FIG. 7 may cover the crossings of the saw streets where the tape burr problem most frequently occurs.

In FIG. 6, the crossings 604 are wider than the respective two of the plurality of saw streets. For example, if crossing A overlies the crossing of saw streets B and C seen from the above, and crossing A has a width in both the horizontal direction and the vertical direction, the width of crossing A may be larger than the width of the saw streets B and C. In this arrangement, the base film above the crossing of saw streets B and C can be thoroughly removed by a laser beam.

In FIG. 7, the circles 704 are wider than the respective two of the plurality of saw streets. For example, if a circle D overlies the crossing of saw streets E and F seen from the above, and the circle D has a diameter X while the saw streets E and F each has a width Y and Z, X is larger than Y and Z. Similar to the arrangement of FIG. 6, the base film above the crossing of the saw streets E and F can be thoroughly removed by a laser beam.

In some embodiments, the saw streets described above are predetermined according to the dimensions and arrangement of semiconductor packages in a semiconductor package array. As such, the portions of the base film to be removed at the ablation regions can be determined in accordance with the locations of the saw streets. That is to say, the locations of the ablation regions can be determined by the coordinates of the saw streets with a predetermined algorithm. In other embodiments, the portions of the base film to be removed at the ablation regions can be determined in real-time using a visualization method. For example, the adhesive tape including the base film and the adhesive layer may be transparent for certain wavelength light. A laser beam generator can identify the saw streets using a visualized mechanism such as a camera, and the generator would determine the locations of the ablation regions according to a predetermined rule. Once the ablation regions are determined, the laser beam generator can produce a laser beam to remove the portions of the base film tape within the ablation regions.

Figure 8:
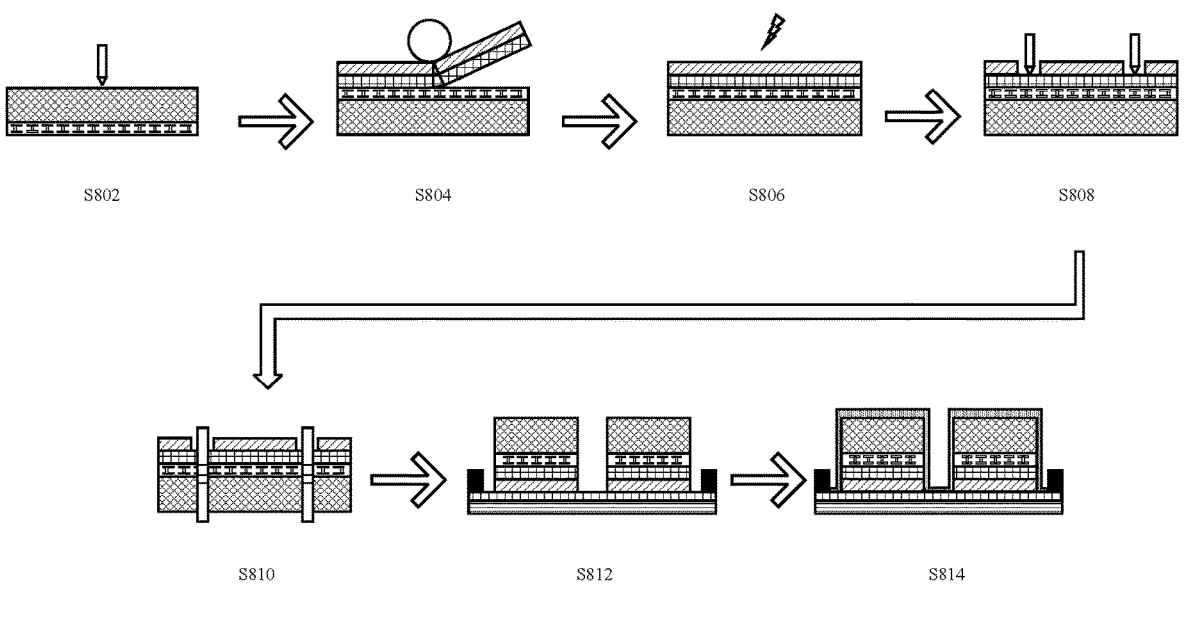
FIG. 8 shows a method for making semiconductor packages according to an embodiment of the present application.

FIG. 8 shows a method 80 for making semiconductor packages according to an embodiment of the present application. As shown in FIG. 8, the method 80 begins with step S802, and laser markings are formed at a second side of the semiconductor package array. The second side is opposite to a first side where an interconnect encasing layer is disposed. At step S804, the semiconductor package array is laminated with an adhesive tape including a base film and an adhesive layer. Then, the adhesive tape can be hardened with UV light at step S806. In other embodiments, the adhesive tape may be heat-sensitive, so it can be hardened by heat. After irradiated by UV light, the semiconductor package array can be positioned under a laser beam, by which at least a portion of the base film can be removed at the predetermined ablation regions at step S808. The method 80 may conduct singulation of the semiconductor package array with one or more cutting saws at step S810. Furthermore, the singulated semiconductor packages are then transferred onto a deposition tape such as a polyimide film at step S812. At step S814, the method 80 applies a shielding layer to the singulated semiconductor packages by such as sputtering.

Figure 9:
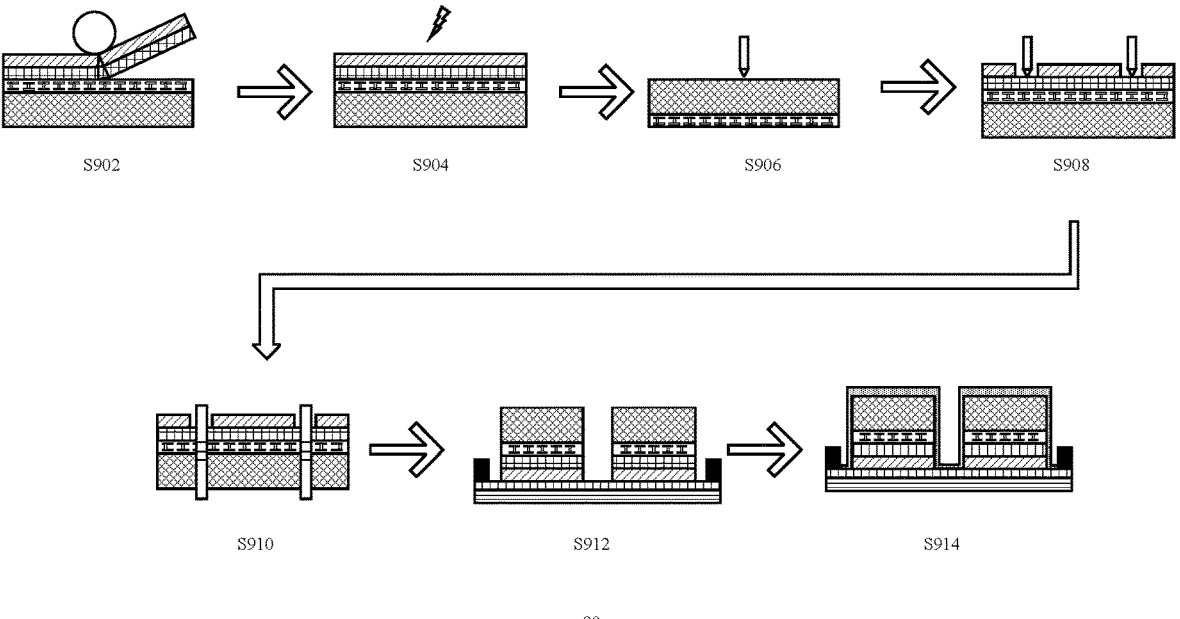
FIG. 9 shows a method for making semiconductor packages according to an embodiment of the present application.

FIG. 9 shows another method 90 for making semiconductor packages according to an embodiment of the present application. Instead of laser marking at the beginning, the method 90 begins with step S902, and an adhesive tape including a base film and an adhesive layer is laminated onto a semiconductor package array. Then, the base film can be hardened with UV light at step S904. Next, the semiconductor package array can be positioned on a turntable for laser processing. The turntable can be rotatable in three degrees of freedom, for example. At step S906, laser markings can be formed at a second side of the semiconductor package array, wherein the second side is opposite to the first side where an interconnect encasing layer is disposed. At step S908, the semiconductor package array can be positioned under a laser beam, by which a portion of the base film can be removed at the predetermined ablation regions. As the turntable holding the semiconductor package array can be rotatable upside and down, a single laser generator may generate laser beams with specifically modulated laser beams to perform the steps S906 and S908. It can be appreciated the steps S906 can S908 can be performed simultaneously or non-simultaneously.

Afterwards, the method 90 may conduct singulation of the semiconductor package array with one or more cutting saws at step S910. Furthermore, the singulated semiconductor packages are then transferred onto a deposition tape such as a polyimide film at step S912. At step S914, the method 90 applies a shielding layer to the singulated semiconductor packages by such as sputtering.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that the present application and the examples herein be considered as exemplary only, with a true scope and spirit of the invention being indicated by the following listing of exemplary claims.

The invention claimed is:

1. A method for making semiconductor packages, comprising:

forming a semiconductor package array, the semiconductor package array having at its first side an interconnect encasing layer;

attaching an adhesive tape onto the interconnect encasing layer, wherein the adhesive tape has an adhesive layer and a base film;

removing, by a laser beam, the base film of the adhesive tape at a predetermined ablation region; and singulating the semiconductor package array along the predetermined ablation region to separate the semiconductor package array into a plurality of semiconductor packages, transferring the plurality of semiconductor packages onto a deposition tape, wherein the adhesive tape is adhered to the deposition tape, and then applying a conductive shield at a second side of each of the plurality of semiconductor packages, wherein the second side is opposite to the first side.

2. The method of claim 1, wherein the adhesive tape is UV sensitive, and the method further comprises:

irradiating the adhesive tape with UV light before removing the base film of the adhesive tape.

3. The method of claim 1, wherein the conductive shield is applied by any of the following: sputtering, spraying, electroplating, printing, painting, laminating, and physical vapor deposition (PVD).

4. The method of claim 1, wherein the conductive shield comprises at least one of the following materials: silver, copper, aluminum, nickel, palladium and chromium.

5. The method of claim 1, wherein before removing the base film of the adhesive tape, the method further comprises:

forming laser markings at a second side of the semiconductor package array, wherein the second side is opposite to the first side.

6. The method of claim 5, wherein the step of forming laser markings at a second side of the semiconductor package array is prior to the step of attaching an adhesive tape onto the interconnect encasing layer.

7. The method of claim 2, wherein the method further comprises:

forming laser markings at a second side of the semiconductor package array subsequent to the irradiating step, wherein the second side is opposite to the first side.

8. The method of claim 5, wherein the steps of forming laser markings at a second side of the semiconductor package array and removing the base film of the adhesive tape at a predetermined ablation region are implemented in a rotatable table holding the semiconductor package array.

9. The method of claim 1, wherein the predetermined ablation region comprises a plurality of lines each overlying a respective one of a plurality of saw streets.

10. The method of claim 9, wherein a width of each of the lines is wider than the respective one of the plurality of saw streets.

11. The method of claim 1, wherein the predetermined ablation region comprises a plurality of crossings each overlying a crossing of two of a plurality of saw streets.

12. The method of claim 11, wherein a width of each of the crossings is larger than the widths of each of respective two of the plurality of saw streets.

13. The method of claim 1, wherein the predetermined ablation region comprises a plurality of circles each centered at a crossing of two of a plurality of saw streets.

14. The method of claim 13, wherein a diameter of each of the circles is larger than the widths of each of the respective two of the plurality of saw streets.

* * * * *